(12) United States Patent
Visconti et al.

(10) Patent No.: US 12,209,885 B2
(45) Date of Patent: Jan. 28, 2025

(54) SENSOR AND METHOD FOR REDUCING AN INTERFERENCE SIGNAL COMPONENT IN A MEASURING SIGNAL FROM A SENSOR

(71) Applicant: Robert Bosch GmbH, Stuttgart (DE)

(72) Inventors: Andrea Visconti, Munich (DE); Francesco Diazzi, Munich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 316 days.

(21) Appl. No.: 17/772,236

(22) PCT Filed: Nov. 17, 2020

(86) PCT No.: PCT/EP2020/082363
§ 371 (c)(1),
(2) Date: Apr. 27, 2022

(87) PCT Pub. No.: WO2021/129981
PCT Pub. Date: Jul. 1, 2021

(65) Prior Publication Data
US 2022/0381583 A1    Dec. 1, 2022

(30) Foreign Application Priority Data
Dec. 23, 2019    (DE) .................... 10 2019 220 545.3

(51) Int. Cl.
*G01D 3/032*    (2006.01)
*B81C 1/00*    (2006.01)
*G01P 15/09*    (2006.01)

(52) U.S. Cl.
CPC ......... *G01D 3/032* (2013.01); *B81C 1/00253* (2013.01); *G01P 15/09* (2013.01)

(58) Field of Classification Search
CPC ...... G01D 3/032; B81C 1/00253; G01P 15/09
See application file for complete search history.

(56) References Cited

U.S. PATENT DOCUMENTS 4,085,361 A * 4/1978 Bathiany ............ G01R 27/28
324/615
5,793,230 A * 8/1998 Chu .................. G01N 27/4148
327/307

(Continued)

FOREIGN PATENT DOCUMENTS

AT    274954 B    10/1969
CN    101335501 A    12/2008

(Continued)

OTHER PUBLICATIONS

International Search Report for PCT/EP2020/082363, Issued Feb. 15, 2021.

(Continued)

*Primary Examiner* — Catherine T. Rastovski
*Assistant Examiner* — Yossef Korang-Beheshti
(74) *Attorney, Agent, or Firm* — NORTON ROSE FULBRIGHT US LLP; Gerard A. Messina

(57) ABSTRACT

A sensor including a sensor element for acquiring a measuring signal, the measuring signal including at least one useful signal component in a useful signal frequency range and at least one interference signal component in an interference signal frequency range, and a readout circuit for converting the measuring signal into an analog electrical sensor signal. A feedback circuit is provided, which feeds back the output signal of the readout circuit to the input of the readout circuit at which the measuring signal is applied, and the total transmission function H(s) of the readout circuit and feedback circuit induces an attenuation of the analog sensor signal in the interference signal frequency range, while the analog sensor signal in the useful signal frequency range is not attenuated.

10 Claims, 3 Drawing Sheets

(56) References Cited

U.S. PATENT DOCUMENTS

| | | |
|---|---|---|
| 2011/0172001 A1 | 7/2011 | Schoerkmaier |
| 2012/0013351 A1 | 1/2012 | Daniel et al. |
| 2014/0314241 A1 | 10/2014 | Penhune |
| 2015/0056940 A1 | 2/2015 | Rangarajan et al. |
| 2017/0328713 A1 | 11/2017 | Beaulaton et al. |

FOREIGN PATENT DOCUMENTS

| | | | | |
|---|---|---|---|---|
| CN | 101742382 A | | 6/2010 | |
| CN | 106301259 A | | 1/2017 | |
| CN | 106461457 A | | 2/2017 | |
| CN | 108827615 A | | 11/2018 | |
| CN | 110380700 A | * | 10/2019 | ............ H03F 1/0211 |
| DE | 102008031643 A1 | | 1/2010 | |
| WO | 9728742 A1 | | 8/1997 | |

OTHER PUBLICATIONS

Baali et al., "Empowering Technology Enabled Care Using IOT and Smart Devices: A Review," IEEE Sensors Journal, vol. 18, No. 5, 2018, pp. 1790-1809.

* cited by examiner

SENSOR AND METHOD FOR REDUCING AN INTERFERENCE SIGNAL COMPONENT IN A MEASURING SIGNAL FROM A SENSOR

FIELD

The present invention relates to a sensor and to a method for reducing an interference signal component in a measuring signal from a sensor.

BACKGROUND INFORMATION

Although the present invention in principle may be used for any undesired signals or interference signal components in a variety of measuring signals, the present invention is described in connection with vibration signals as undesired signals or as an interference signal component and in connection with measuring signals of an MEMS gyroscope.

MEMS gyroscopes can by now be found in numerous portable electronic devices for the consumer, e.g., in smartphones or the like, in order to enable a navigation in the interior of buildings or the like. In many applications the MEMS gyroscope is exposed to vibrations such as by a mechanical motor used in smartphones for generating a vibration alarm, or also by a loudspeaker. Such vibrations lead to imprecise measured values of the MEMS gyroscope. To solve the problem, it has become known to make the mechanical structure as stiff or firm as possible along the direction of the anticipated vibration or to use the most symmetrical 2-mass structures for the MEMS gyroscope.

In reality, however, such an undesired vibration signal in the sensor signal is not entirely avoidable. The strength of the undesired vibration signal/interference signal component may not only exceed that of the desired yaw rate signal of the MEMS gyroscope but also the measuring range of the MEMS gyroscope system as a whole, which leads to "jamming" or to a saturation of an electronic circuit downstream in the signal path and ultimately to a loss of the signal integrity. A further problem is that the yaw rate signal of the MEMS gyroscope is usually modulated, which—depending on the type of demodulation—leads to a falsification of the demodulated signal because of components of the undesired vibration signal.

SUMMARY

In one embodiment, the present invention provides a sensor which comprises at least
a. a sensor element for acquiring a measuring signal, the measuring signal including at least one useful signal component in a useful signal frequency range and at least one interference signal component in an interference signal frequency range, and
b. a readout circuit for converting the measuring signal into an analog electrical sensor signal.

The sensor according to an example embodiment of the present invention includes a feedback circuit which feeds back the output signal of the readout circuit to the input of the readout circuit where the measuring signal is applied, the total transmission function H(s) of readout circuit and feedback circuit inducing an attenuation of the analog sensor signal in the interference signal frequency range, while the analog sensor signal in the useful signal frequency range is not attenuated.

In a further embodiment, the present invention provides a method for reducing an interference signal component in a measuring signal of a sensor. In accordance with an example embodiment of the present invention, the method comprises the following steps:
Acquiring a measuring signal with the aid of the sensor, the measuring signal including at least one useful signal component in a useful signal frequency range and at least one interference signal component in an interference signal frequency range,
converting the measuring signal into an analog electrical sensor signal with the aid of a readout circuit,
feeding back the output signal of the readout circuit with the aid of a feedback circuit to the input of the readout circuit where the measuring signal is applied, the total transmission function H(s) of the readout circuit and feedback circuit causing an attenuation of the analog electrical sensor signal in the interference signal frequency range, while the analog sensor signal in the useful signal frequency range is not attenuated.

The measures according to the present invention make it possible to compensate for interference effects, e.g., vibrations, that occur in the measuring environment of the sensor, act on the sensor and superpose the actual measured variable, that is, a rotary movement in the case of a yaw rate sensor. Embodiments of the present invention achieve this compensation with the aid of a feedback circuit which suppresses a certain frequency range of the measuring signal, i.e., the frequency range of the expected interference signal component.

One of the advantages this achieves is that a demodulation of MEMS gyroscope signals is able to be carried out more precisely and easily, e.g., with the aid of a square wave signal, without components of the interference signal component falsifying the demodulation. Another advantage is that the signal integrity is ensured even in the case of large vibrations. The reliability is therefore increased. Another advantage is the reduction of undesired vibration signals or interference signal components in the following electronic further processing of the measuring signal. The signal-to-noise ratio is improved in addition.

According to one advantageous further refinement of the present invention, the feedback circuit is configured in such a way that the transmission function F(s) of the feedback circuit induces an attenuation of the analog sensor signal in the useful signal frequency range and an amplification of the analog sensor signal in the interference signal frequency range, and that the output signal of the readout circuit is fed back to the input of the readout circuit where it is subtracted from the measuring signal. This has the advantage that the interference signal component is easily able to be reduced, minimized or even suppressed outside the desired useful signal frequency range.

According to a further advantageous refinement of the present invention, the transmission function F(s) of the feedback circuit has different amplification factors for the useful signal frequency range and for the interference signal frequency range, the ratio between these different amplification factors amounting to at least 10. The ratio could also range from 2 to 10, but preferably to at least 10, in particular at least 100. This allows for a reliable and adequate reduction of undesired signals, i.e., interference signal components, in the measuring signal outside the useful signal frequency range.

According to a further advantageous refinement of the present invention, the feedback circuit includes a notch filter for the useful signal frequency range. Frequencies within a narrow frequency range are easily able to be filtered out with the aid of a notch filter.

According to a further advantageous embodiment of the present invention, the feedback circuit includes a resonator for the interference signal frequency range. This makes it possible to provide a simple and economical filter for signal components that have frequencies in the interference signal frequency range.

According to a further advantageous embodiment of the present invention, the feedback circuit includes a high-pass filter for a frequency range above the useful signal frequency range. This provides a particularly simple filter for signal components having frequencies above the useful signal frequency range.

The measures according to the present invention are especially suitable for sensors whose measuring signal acquisition is based on the mechanical deflection of at least one mechanically deflectable structural element. In this case, mechanical interference effects that are restricted to a defined frequency range are able to be compensated for by the measures according to the present invention in an especially simple and effective manner.

According to a further advantageous refinement of the present invention, the sensor element is an MEMS sensor element, in particular a yaw rate sensor, an acceleration sensor, a pressure sensor or a microphone. This is advantageous insofar as a multitude of different forms of the sensor element and thus a wide application range of the sensor element is provided while the space is kept extremely limited at the same time.

According to a further advantageous refinement of the present invention, the measuring signal is acquired capacitively and the readout circuit includes a capacitance-voltage converter, and the feedback circuit feeds back the output signal of the capacitance-voltage converter to the input of the capacity-voltage converter.

It is of course understood that the previously mentioned features and the features still to be described in the following text may not only be used in the indicated combination, but also in other combinations or on their own without departing from the scope of the present invention.

Preferred designs and embodiments of the present invention are shown in the figures and discussed in greater detail in the following description, in which identical reference numerals relate to same or similar or functionally equivalent components or elements.

DETAILED DESCRIPTION OF EXAMPLE EMBODIMENTS

Figure 1:
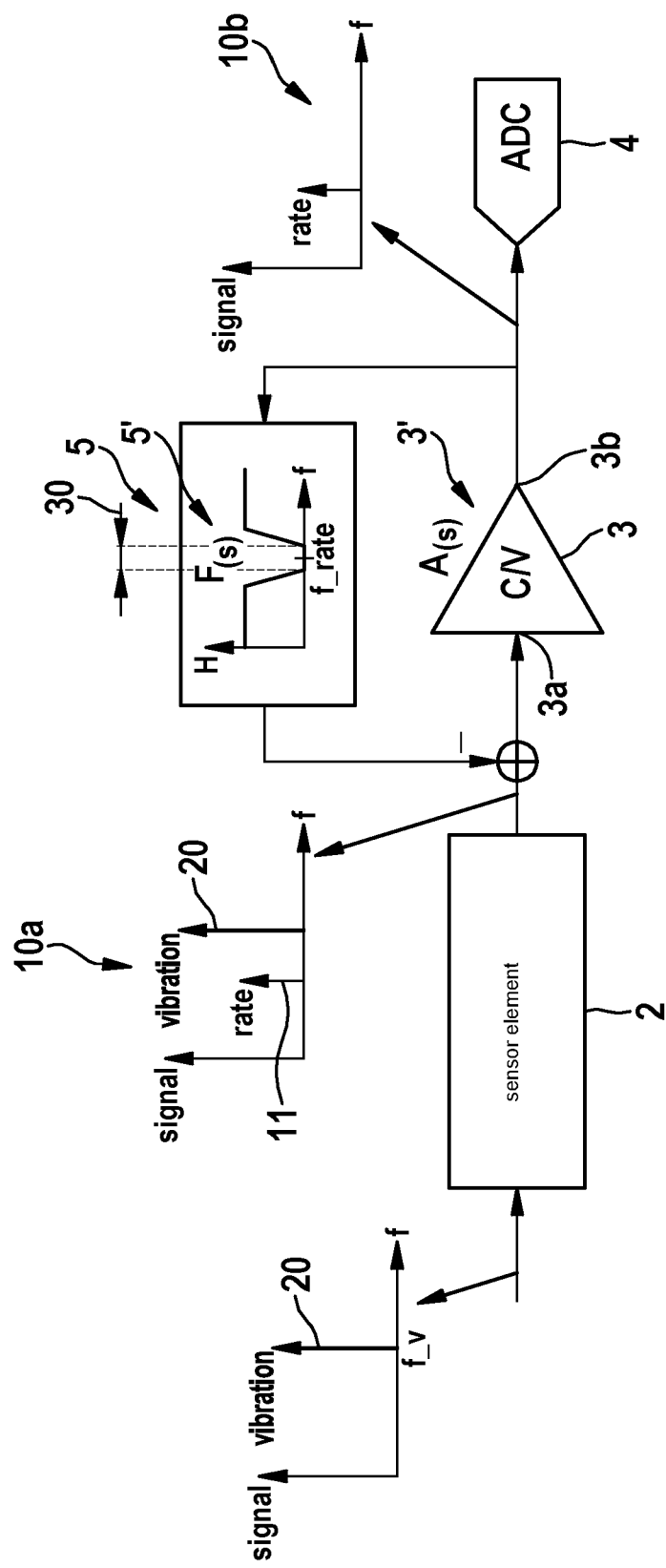
FIG. 1 shows a circuit diagram with components of a sensor according to an example embodiment of the present invention.

The circuit shown in FIG. 1 includes a sensor element 2 for acquiring a measuring signal, and a readout circuit 3 for converting the measuring signal into an analog electrical sensor signal. In the described embodiment, sensor element 2 is the sensor element of an MEMS gyroscope. Sensor element 2 includes at least one seismic mass which is excited to a defined oscillation movement for the purpose of acquiring a measuring signal. In case of a rotary movement of sensor element 2 about an axis perpendicular to the oscillation direction of the seismic mass, a Coriolis force acts on the oscillating seismic mass. In the exemplary embodiment described here, the deflection of the seismic mass perpendicular to the oscillation direction and perpendicular to the axis of rotation caused by this force is acquired capacitively. The deflection of the seismic mass caused by a rotary movement of sensor element 2 is proportional to the yaw rate and is referred to as the useful signal component 11 in the following text. The frequency of this useful signal component 11 is a function of the excitation frequency, that is, the frequency of the defined oscillation movement of the seismic mass. The frequency range of useful signal component 11, which is termed the useful signal frequency range 30, is therefore able to be defined very well.

In addition to the useful signal component, the measuring signal includes at least one interference signal component 30 which superposes useful signal component 11. In the described exemplary embodiment, an interference signal caused by a vibration of sensor element 2 is superposed to the yaw rate signal. This is sketched in FIG. 1 by the frequency representation of vibration 20 acting on sensor element 2.

In addition to desired yaw rate signal 11 as the useful signal, the measuring signal output by sensor element 2 thus includes also undesired vibration signal 20 as an interference signal component. The frequency range of this vibration signal 20, hereinafter referred to as interference signal frequency range, is likewise clearly defined, does not overlap with the useful signal frequency range and lies clearly above useful signal frequency range 30, which may be gathered from the frequency representation 10a of the measuring signal.

Measuring signal 10a acquired by sensor element 2 is converted into an analog electrical measuring signal with the aid of readout circuit 3. In this particular case, the acquisition of the measuring signal takes place capacitively, and readout circuit 3 includes a capacitance-voltage converter having transmission function A(s) 3' for converting measuring signal 10 into an analog electrical signal.

Situated between an output 3b of capacitance-voltage converter 3 and an input 3a of capacitance-voltage converter 3 is a feedback circuit 5 which applies a feedback circuit transmission function F(s) 5' to the output signal of capacitance-voltage converter 3 that has the largest possible amplification outside the useful signal frequency range 30, in particular in the interference signal frequency range. The amplification thus occurs in the frequency range in which an undesired signal, e.g., vibration signal 20 or the like, appears. Conversely, the lowest possible amplification is used in the range of the useful signal frequency range 30. The signal amplified in this way is fed back to input 3a of capacitance-voltage converter 3 by being subtracted from an input signal at input 3a. This reduces undesired interference signal component 20.

As a whole, the transmission functions A(s) 3' and F(s) 5' result in a total transmission function H(s) for the two circuit components evaluation circuit 3 and feedback circuit 5 of sensor 1 according to $$H(s) = \frac{A(s)}{1 + A(s) \cdot F(s)}$$

In the described exemplary embodiment, the total transmission function H(s) thus has the following characteristics:

The total transmission function H(s)→A(s) if the feedback circuit transmission function F(s) goes→0, or in other words, yaw rate signal 11 is converted into an analog electrical voltage signal 10b essentially without any effect by feedback circuit 5.

Total transmission function H(s)→0 if feedback circuit transmission F(s) goes→∞, or in other words, the undesired signal or interference signal component 20 is suppressed for the most part.

For example, feedback circuit transmission function F(s) 5' is able to be provided with the aid of a notch filter in a useful signal frequency range 30, a resonator at a frequency of an undesired interference signal to be expected, and/or with the aid of a high-pass filter for frequencies above useful signal frequency range 30 in feedback circuit 5.

The analog measuring signal, largely purged of the interference signal component in the above-described manner, is then converted with the aid of an analog-to-digital converter 4, ADC, into a digital signal that in essence is ultimately based on the useful signal component of the MEMS gyroscope.

Figure 2:
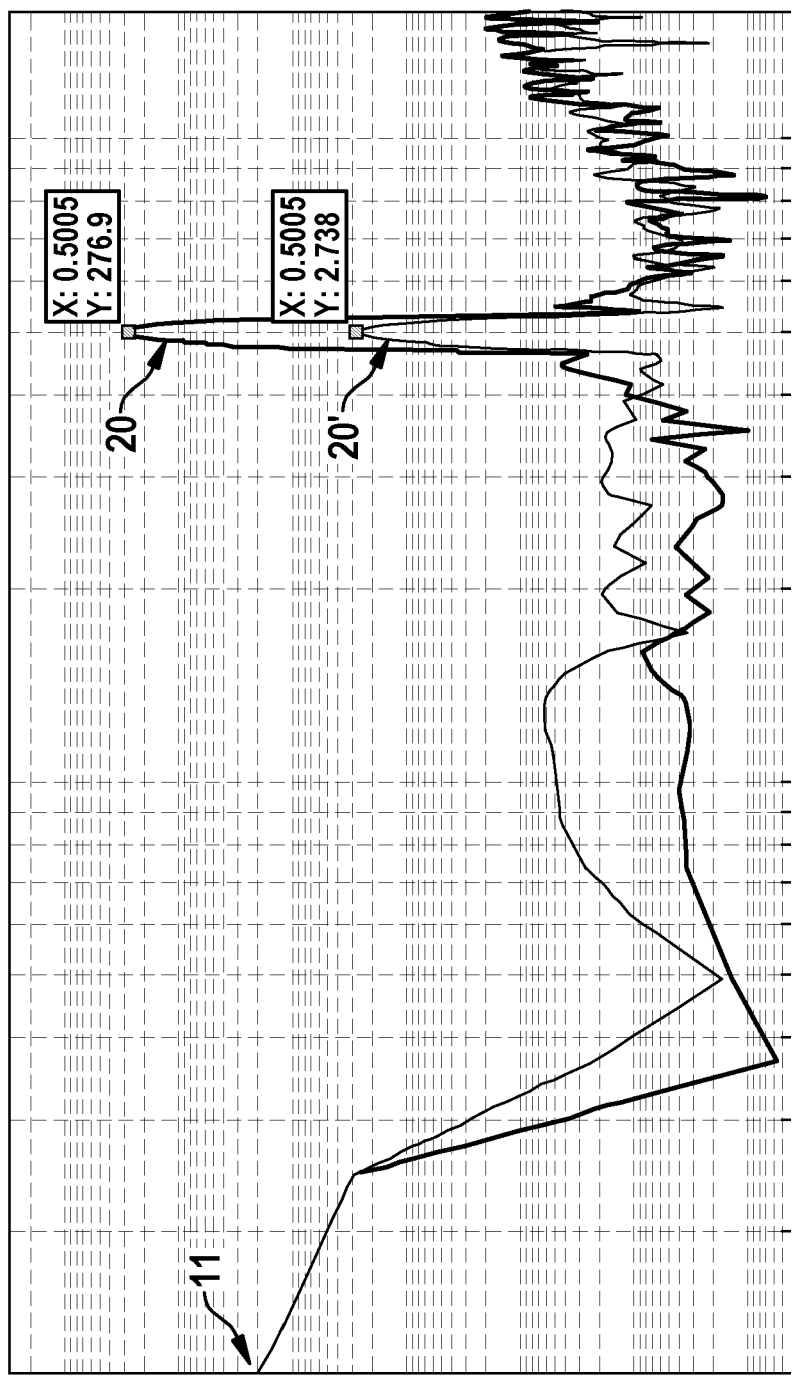
FIG. 2 shows a comparison of a conventional gyroscope measuring signal and a gyroscope measuring signal to which a method according to the present invention is applied.

In comparison, FIG. 2 shows the frequency representation of two gyroscope measuring signals that were recorded under identical test conditions, one without and one with the compensation according to the present invention of a vibration-related interference signal component. In other words, FIG. 2 illustrates the effects of the measures by comparing frequency representations 20 and 20' of two gyroscope measuring signals that were acquired under identical test conditions. The x-axis denotes the frequency, the y-axis denotes the frequency components in the measuring signal. The gyroscope was exposed to a mechanical vibration in this case, i.e., in a defined frequency range about the frequency X, in order to simulate an interference signal component in the gyroscope measuring signal. A DC voltage was applied as the useful signal component so that the frequency range of useful signal component 11 lies at zero here. In one case—frequency representation 20—no measures were taken to attenuate or compensate the vibration-related interference signal component in the gyroscope measuring signal. In the other case—frequency representation 20'—the measures for compensating for a vibration-related interference signal component as described in connection with the embodiments of FIG. 1 were applied, i.e., using an amplification factor of 100 in feedback circuit 5. The comparative illustration of FIG. 2 demonstrates that the measures attenuate the interference signal component by a factor of approximately 100 in each case while useful signal component 11 is essentially unaffected by feedback circuit 5.

Figure 3:
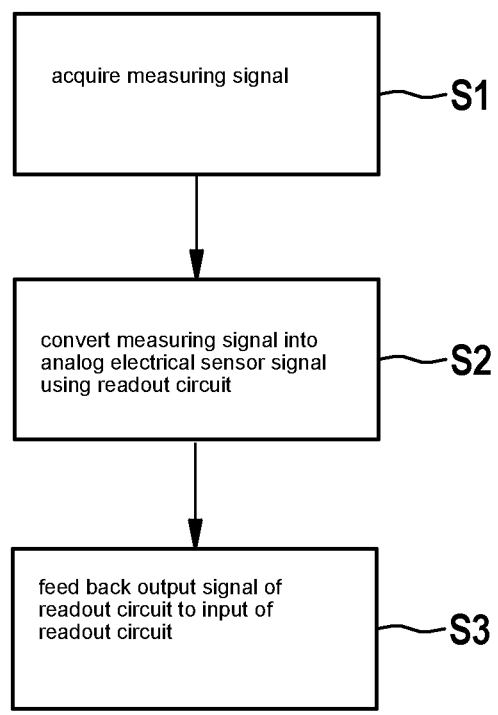
FIG. 3 shows steps of a method according to an example embodiment of the present invention.

FIG. 3 shows steps of a method for reducing undesired signals in a sensor signal.

The method includes the following steps:

In a first step S1, a measuring signal is acquired with the aid of the sensor, the measuring signal including at least one useful signal component in a useful signal frequency range and at least one interference signal component in an interference signal frequency range.

In a further step S2, the measuring signal is converted into an analog electrical sensor signal with the aid of a readout circuit.

In a further step S3, the output signal of the readout circuit is fed back to the input of the readout circuit at which the measuring signal is applied with the aid of a feedback circuit, and the total transmission function H(s) of the readout circuit and feedback circuit induces an attenuation of the analog electrical sensor signal in the interference signal frequency range, while the analog sensor signal in the useful signal frequency range is not attenuated.

In summary, at least one of the embodiments of the present invention offers at least one of the following advantages:
- a suppression of interference signals in a measuring signal essentially without an adverse effect on useful signals in the measuring signal,
- an improvement of the signal-to-noise ratio,
- an easier demodulation of sensor signals,
- an increased reliability of the sensor.

Although the present invention was described on the basis of preferred exemplary embodiments, it is not restricted to such but is able to be modified in a multitude of ways.

What is claimed is:

1. A sensor, comprising:
   a sensor element configured to acquire a measuring signal, the measuring signal including at least one useful signal component in a useful signal frequency range and at least one interference signal component in an interference signal frequency range;
   a readout circuit configured to convert the measuring signal into an analog electrical sensor signal; and
   a feedback circuit which feeds back an output signal of the readout circuit to an input of the readout circuit at which the measuring signal is applied, wherein a total transmission function of the readout circuit and the feedback circuit induces an attenuation of the analog sensor signal in the interference signal frequency range, while the analog sensor signal in the useful signal frequency range is not attenuated,
   wherein the feedback circuit is configured in such a way that a transmission function of the feedback circuit induces an attenuation of the analog sensor signal in the useful signal frequency range and an amplification of the analog sensor signal in the interference signal frequency range.

2. A sensor, comprising:
   a sensor element configured to acquire a measuring signal, the measuring signal including at least one useful signal component in a useful signal frequency range and at least one interference signal component in an interference signal frequency range;
   a readout circuit configured to convert the measuring signal into an analog electrical sensor signal; and
   a feedback circuit which feeds back an output signal of the readout circuit to an input of the readout circuit at which the measuring signal is applied, wherein a total transmission function of the readout circuit and the feedback circuit induces an attenuation of the analog sensor signal in the interference signal frequency range, while the analog sensor signal in the useful signal frequency range is not attenuated,
   wherein the feedback circuit is configured in such a way that a transmission function of the feedback circuit induces an attenuation of the analog sensor signal in the useful signal frequency range and an amplification of the analog sensor signal in the interference signal frequency range, and the output signal of the readout circuit is fed back to the input of the readout circuit where it is subtracted from the measuring signal.

3. The sensor as recited in claim 2, wherein the transmission function of the feedback circuit has different amplification factors for the useful signal frequency range and for the interference signal frequency range, and the ratio between the different amplification factors amounts to at least 10.

4. The sensor as recited in claim 2, wherein the feedback circuit includes a notch filter for the useful signal frequency range.

5. The sensor as recited in claim 2, wherein the feedback circuit includes a resonator for the interference signal frequency range.

6. The sensor as recited in claim 2, wherein the feedback circuit has a high-pass filter for a frequency range above the useful signal frequency range.

7. The sensor as recited in claim 2, wherein the sensor element includes at least one mechanically deflectable structural element for the acquisition of measuring signals.

8. The sensor as recited in claim 1, wherein the sensor element includes a MEMS sensor element, the MEMS sensor element including a yaw rate sensor, or an acceleration sensor, or a pressure sensor or a microphone.

9. The sensor as recited in claim 1, wherein the acquisition of the measuring signal takes place capacitively, and the readout circuit includes a capacitance-voltage converter, and the feedback circuit feeds an output signal of the capacitance-voltage converter back to an input of the capacitance-voltage converter.

10. A method for reducing an interference signal component in a measuring signal of a sensor, comprising the following steps:

acquiring a measuring signal using the sensor, the measuring signal including at least one useful signal component in a useful signal frequency range and at least one interference signal component in an interference signal frequency range;

converting the measuring signal into an analog electrical sensor signal using a readout circuit; and feeding, via a feedback circuit, an output signal of the readout circuit back to an input of the readout circuit at which the measuring signal is applied, wherein a total transmission function of the readout circuit and the feedback circuit induces an attenuation of the analog electrical signal in the interference signal frequency range, while the analog sensor signal in the useful signal frequency range is not attenuated, wherein the feedback circuit is configured in such a way that a transmission function of the feedback circuit induces an attenuation of the analog sensor signal in the useful signal frequency range and an amplification of the analog sensor signal in the interference signal frequency range.

* * * * *